United States Patent [19]
Stinson et al.

[11] Patent Number: 6,127,858
[45] Date of Patent: Oct. 3, 2000

[54] METHOD AND APPARATUS FOR VARYING A CLOCK FREQUENCY ON A PHASE BY PHASE BASIS

[75] Inventors: Jason C. Stinson, Mountain View; Edwin R. Lilya, Folsom; Mathew B. Nazareth, Rancho Cordova, all of Calif.

[73] Assignee: Intel Corporation, Santa Clara, Calif.

[21] Appl. No.: 09/071,375

[22] Filed: Apr. 30, 1998

[51] Int. Cl.[7] .......................... H03K 17/00; H03H 11/26
[52] U.S. Cl. ............................... 327/99; 327/276
[58] Field of Search .................. 327/263, 264, 327/269, 270, 271, 276, 277, 284, 399, 407, 99, 232, 252, 395, 400, 170, 113

[56] References Cited

U.S. PATENT DOCUMENTS

| | | | |
|---|---|---|---|
| 4,626,716 | 12/1986 | Miki | 327/270 |
| 4,777,385 | 10/1988 | Hartmeier | 327/407 |
| 4,980,585 | 12/1990 | Bazes | 327/106 |
| 5,045,715 | 9/1991 | Fitch | 327/174 |
| 5,093,841 | 3/1992 | Vancraeynest | 375/1 |
| 5,463,337 | 10/1995 | Leonowich | 327/158 |
| 5,661,731 | 8/1997 | Yip et al. | 371/22.1 |
| 5,719,515 | 2/1998 | Danger | 327/270 |
| 5,796,673 | 8/1998 | Foss et al. | 365/233 |
| 5,818,890 | 10/1998 | Ford et al. | 375/371 |
| 5,857,095 | 1/1999 | Jeddeloh et al. | 395/552 |

OTHER PUBLICATIONS

"Precise Delay Generation Using Coupled Oscillators", *IEEE Journal of Solid–State Circuits*, vol. 28, No. 12, Dec. 1993, John G. Maneatis and Mark A. Horowitz, pp. 1273 to 1282.

"An Interpolating Clock Synthesizer", *IEEE Journal of Solid–State Circuits*, vol. 31, No. 9, Sep. 1996, Mel Bazes, Roni Ashuri and Ernest Knoll, pp. 1295–1301.

*Primary Examiner*—My-Trang Nuton
*Attorney, Agent, or Firm*—Blakely, Sokoloff, Taylor & Zafman LLP

[57] ABSTRACT

A circuit to vary a frequency of an input clock is disclosed. The circuit includes a delay generator to generate at least two delayed clocks from the input clock and a select circuit coupled to receive the at least two delayed clocks and provide an output clock from one of the at least two delayed clocks. The select circuit switches the output clock from the one of the at least two delayed clocks to the other of the at least two delayed clocks on a first edge.

21 Claims, 5 Drawing Sheets

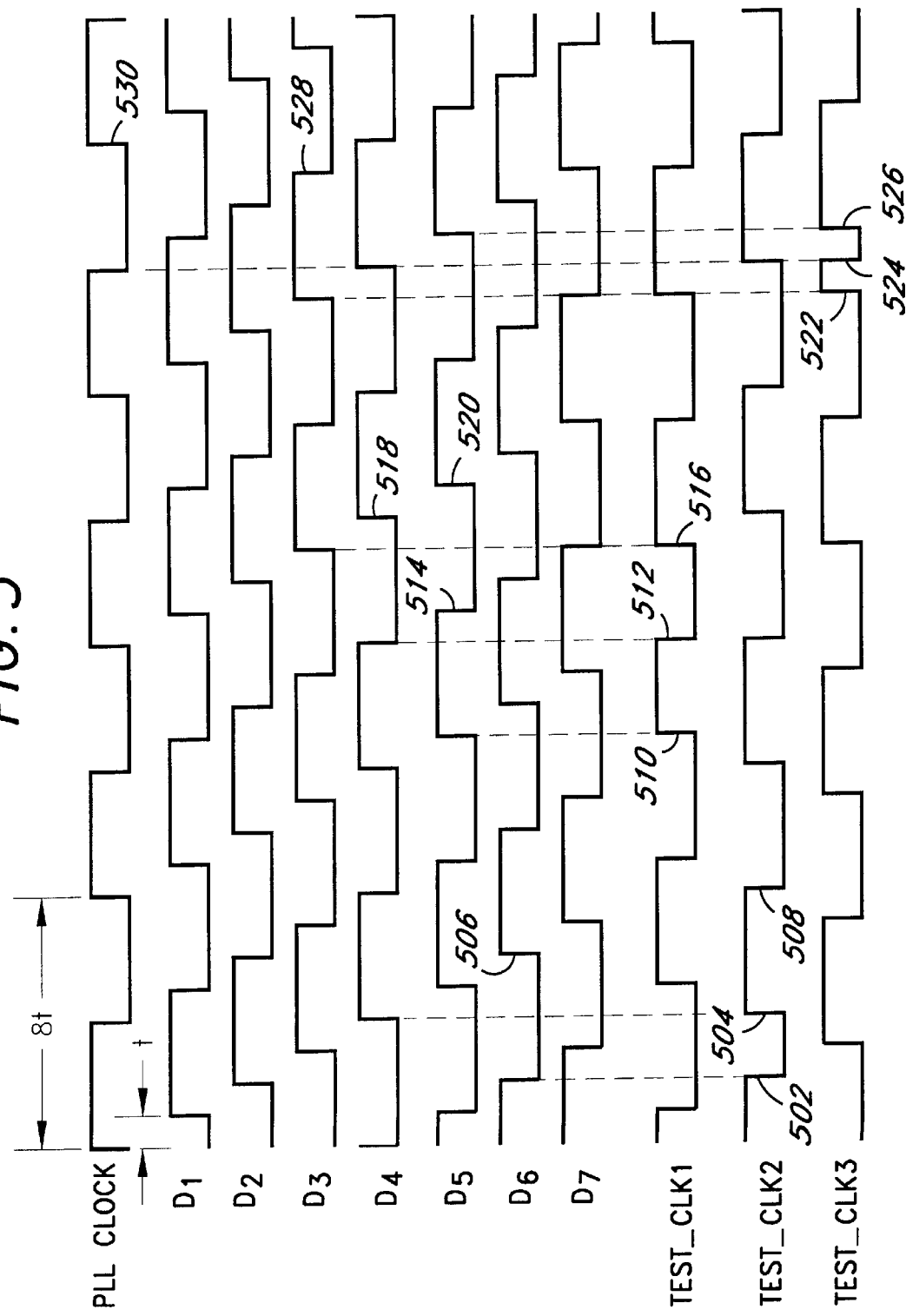

ized clocks.

METHOD AND APPARATUS FOR VARYING A CLOCK FREQUENCY ON A PHASE BY PHASE BASIS

BACKGROUND OF THE INVENTION

1. Field of the Invention

The present invention relates generally to the field of clock circuits, and specifically, to a method and apparatus for varying a clock frequency on a phase by phase basis.

2. Background Information

Component testers are often used to test and debug critical speed paths on newly designed microprocessors. A component tester is typically connected to the microprocessor and generates a test clock used to drive one or more functional units (also hereinafter referred to as the core) contained therein. The functional units include, for example, the data path, input units, execution units, cache, output units, and the like.

Clock shrinking is a mechanism by which the frequency of a clock (or group of clocks) is changed dynamically during the execution of a microprocessor. The term "shrinking" is used to denote that the frequency of a clock cycle of interest is reduced relative to other clock cycles. Clock shrinking is a debug tool for testing newly designed microprocessors and other types of integrated circuits. By shrinking a single clock (and leaving the other clocks at a lower, passing frequency), a single critical path can be isolated in a test or diagnostic that contains many critical speed paths.

Normally, in a high frequency microprocessor design, the core clock is generated from a phase-locked loop ("PLL"). The PLL is an analog circuit that generates a perfect, even duty cycle clock from an imperfect, uneven duty cycle clock across a wide range of process skews, voltages, and temperatures. The PLL also guarantees that the generated clock's rising edge is synchronized with the rising edge of the input clock. The PLL is used primarily to "clean up" a noisy, system bus clock before being driven to the microprocessor core as well as ensure that the core clock is still synchronized to the external clock.

FIG. 1 illustrates a prior art test system 100. The test system 100 includes a tester 110 coupled to a microprocessor 130 by way of signal line 120. Under test condition, the tester 110 transmits a test clock along signal line 120 to the microprocessor 130. The test clock typically includes one or more shrunk and/or stretched clocks for testing various functional units within the microprocessor 130. The test clock bypasses the PLL and drives the internal core clock directly. In this manner, a shrunk and/or stretched clock generated is passed directly into the functional units within the microprocessor. If the test clock is fed to the PLL, the PLL will attempt to "clean up" an intentional shrunk and/or stretched clock. The shrunk and/or stretched clock is treated as system noise and will either be re-adjusted back to the original frequency or break the lock of the PLL and cause it to spin out of control.

However, using an external tester to generate a varied clock and bypassing the PLL means that any system noise or inaccuracy is also passed directly into the core. For this reason, clock shrinking and/or stretching has only been possible on expensive component testers, which are capable of generating accurate, high frequency clocks. In recent years, however, the core frequency of microprocessors has been increasing at a faster rate than the capabilities of the component testers which makes it nearly impossible to provide an external clock at today's core frequencies.

Accordingly, there is a need in the technology for a method and apparatus for varying the clock frequency of one or more clocks on a cycle by cycle basis.

SUMMARY OF THE INVENTION

In one embodiment, the present invention is a circuit to vary a frequency of an input clock. The circuit includes a delay generator to generate at least two delayed clocks from the input clock and a select circuit coupled to receive the at least two delayed clocks and provide an output clock from one of the at least two delayed clocks. The select circuit switches the output clock from the one of the at least two delayed clocks to the other of the at least two delayed clocks on a first edge.

BRIEF DESCRIPTION OF THE DRAWINGS

The features and advantages of the present invention will become apparent from the following detailed description of the present invention in which:

FIG. 5 illustrates an exemplary timing diagram of the inputs and output signals of the multiplexer of FIG. 3.

DETAILED DESCRIPTION

The present invention is a method and apparatus for varying a clock frequency on a phase by phase basis. In one implementation, a clock variator circuit is implemented within an integrated circuit (e.g., a microprocessor) and includes a delay generator circuit which generates delayed clocks (versions) of an internal clock (e.g., a phase locked loop "PLL" clock) and a multiplexer which receives the internal clock and the delayed clocks and provides a clock signal having at least one clock phase that is varied from the remainder of the clock phases by selecting specific edges of the internal clock and the delayed clocks.

In one embodiment, the clock variator circuit provides a shrunk clock phase (e.g., a low phase or a high phase of a clock cycle) by switching an output clock from a delayed clock to a second delayed clock on a clock edge. In this embodiment, the clock variator circuit may provide a shrunk clock cycle by switching the output clock from the second delayed clock to a third clock on a second clock edge. The third clock may be the internal clock or a further delayed clock. In another embodiment, the clock variator circuit provides a stretched clock phase (e.g., a low phase or a high phase of a clock cycle) by switching the output clock from a delayed clock to a second delayed clock on a clock edge. In this embodiment, the clock variator circuit may provide a stretched clock cycle by switching the output clock from the second delayed clock to a third clock on a second clock edge. The third clock may be the internal clock or a further delayed clock.

In the following description, for purposes of explanation, numerous details are set forth in order to provide a thorough understanding of the present invention. However, it will be apparent to one skilled in the art that these specific details are not required in order to practice the present invention.

Figure 2:
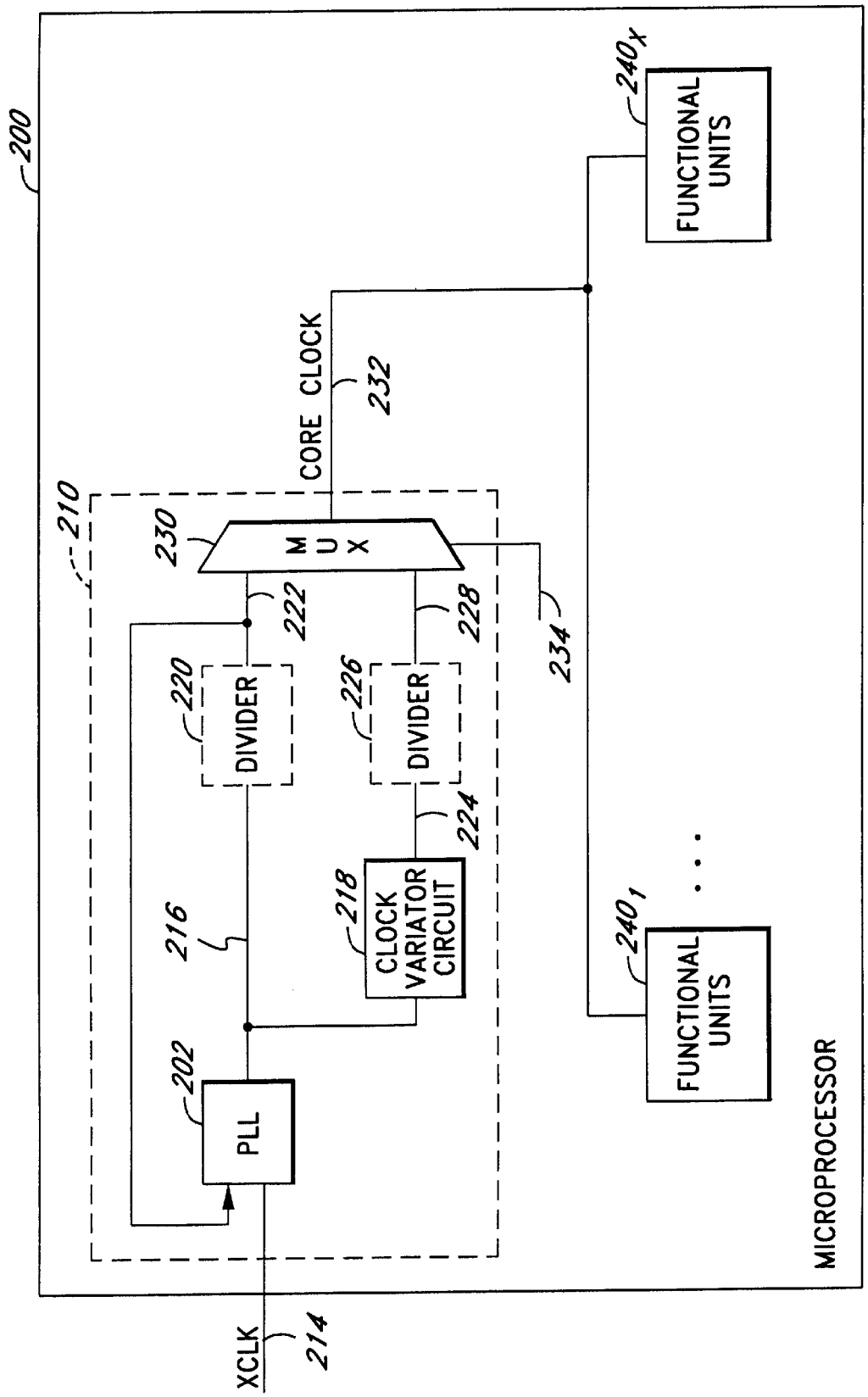
FIG. 2 illustrates an exemplary embodiment of a microprocessor implementing one embodiment of the present invention.

FIG. 2 illustrates an exemplary embodiment of a microprocessor 200 implementing one embodiment of the present invention. Referring to FIG. 2, the microprocessor 200 includes a clock generator circuit 210 which receives an external clock XCLK on signal line 214 (typically from an oscillator or a crystal) and provides a CORE CLOCK on signal line 232. The CORE CLOCK is fed to a plurality of functional units $240_1$–$240_X$ (where "X" is a positive whole number). The functional units, include, for example, the data path unit, ALU, execution unit, cache, and the like.

The clock generator circuit 210 includes a PLL 202 which receives XCLK and generates a perfect, even duty cycle PLL clock on signal line 216. Since the PLL clock may not guarantee a 50% duty cycle, the PLL clock may optionally be fed to a divider circuit 220 (shown by dashed lines) which divides the frequency of the PLL clock by two, in which case the PLL 202 may generate a clock having twice the frequency. The divider circuit 220 switches every other rising edge of the PLL clock to a falling edge to ensure a 50% duty cycle. The output of the divider circuit 220 is fed back to the PLL 202 to ensure that the rising edge of the clock on signal line 222 (and the CORE CLOCK 232) is synchronous with the rising edge of XCLK on signal line 214. The output of the divider circuit 220 is coupled to a multiplexer 230 which, in normal mode, is selected by control line 234 to provide the PLL clock as the CORE CLOCK.

The PLL 202 is also coupled to a clock variator circuit 218 which receives the PLL clock on signal line 216 and generates a clock on signal line 224 which may have one or more shrunk and/or stretched clock phases. The clock variator circuit 218 internally generates one or more discrete delayed versions of the PLL clock and provides a TEST CLOCK on signal line 224 having at least one clock phase that is varied from the remainder of clock phases by selecting, on an edge basis, from the discrete delayed version and the PLL clock and/or the PLL clock. The TEST CLOCK may optionally be fed to a divider circuit 226 (shown by dashed lines) which divides the TEST CLOCK by two. This reduces the complexity of the clock variator circuit 218 and a control circuit (see, e.g., FIG. 8) because only one clock edge (e.g., the rising edge) needs to be varied instead of both the rising and falling edges. The edge that is varied is fed to the divider circuit which makes every effectively varies both edges. In a test mode, (e.g., validation testing, speed path testing/debugging, etc.) the multiplexer 230 is controlled by way of control line 234 to provide the TEST CLOCK as the CORE CLOCK.

Figure 1:
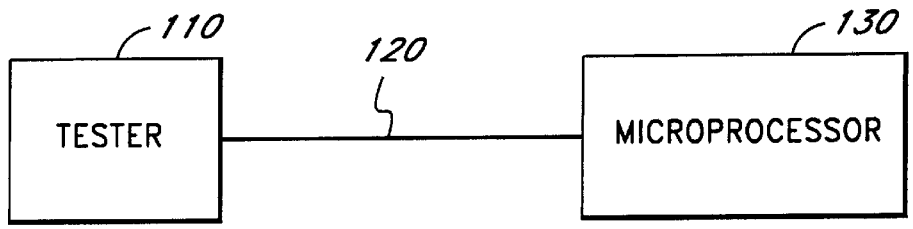
FIG. 1 illustrates a prior art test system.
Figure 3:
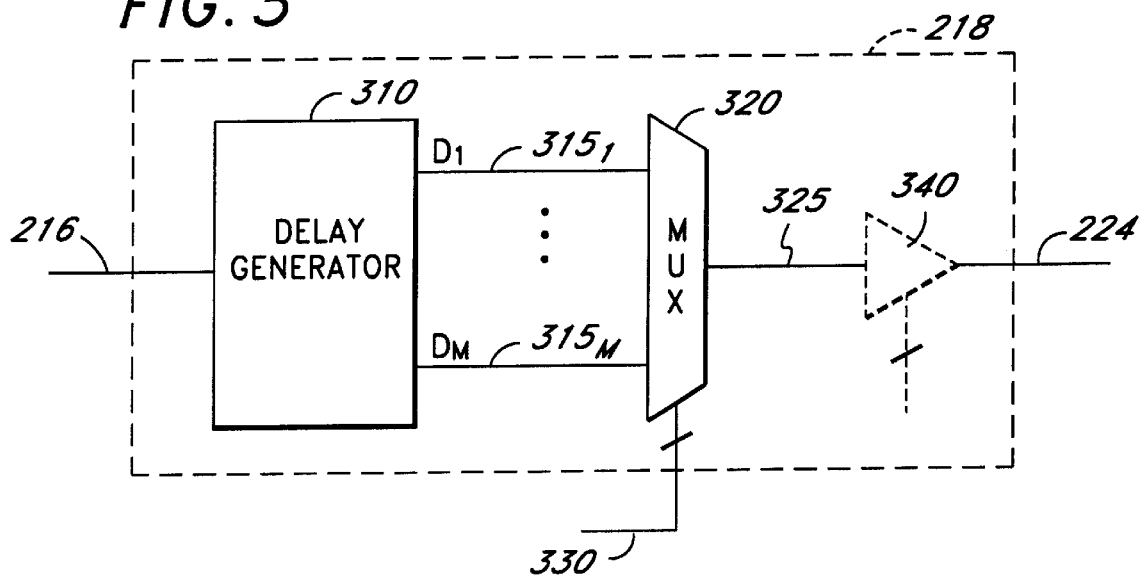
FIG. 3 illustrates an exemplary embodiment of the clock variator circuit of FIG. 2.

FIG. 3 illustrates an exemplary embodiment of the clock variator circuit 218 of FIG. 2. Referring to FIG. 3, the clock variator circuit 218 includes a delay generator circuit 310 which receives the PLL clock on signal line 216 and generates one or more clock signals $D_1$–$D_M$ on signal lines $315_1$–$315_M$ (where "M" is a positive whole number) that are fed to a multiplexer 320. The one or more clock signals $D_1$–$D_M$ are delayed versions of the PLL clock. In addition to the one or more clock signals $D_1$–$D_M$, the PLL clock may also be fed to the multiplexer 320 (not shown in this Figure).

In one embodiment, the multiplexer 320 provides a TEST CLOCK on signal line 325 by selecting, on an edge-by-edge basis, one or more of the clock signals $D_1$–$D_M$. It is contemplated that other circuitry may be used in lieu of the multiplexer 320 to emulate its functionality. Thus, circuitry having the functionality of the multiplexer 320 itself may be generally referred to as "select circuitry". The multiplexer 320 is controlled through control lines 330 by a state machine (not shown) which selects the TEST CLOCK (discussed below). The TEST CLOCK may optionally be fed to an interpolating circuit 340, as shown by dashed lines. An exemplary embodiment of the interpolating circuit 340 and a corresponding timing diagram will be discussed with reference to FIGS. 6 and 7, respectively.

Figure 8:
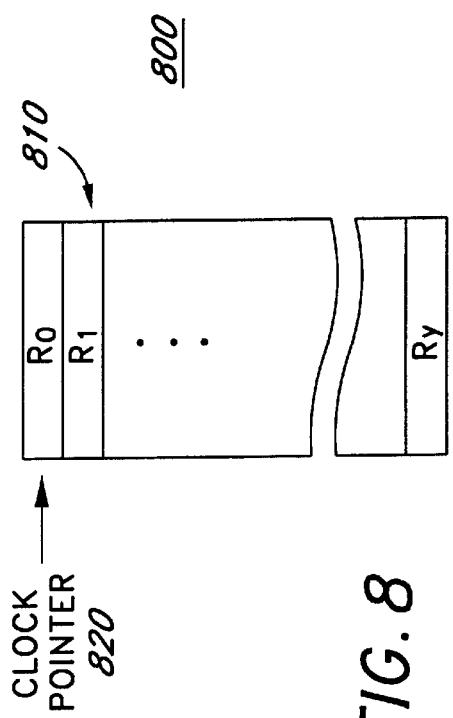
FIG. 8 illustrates an exemplary embodiment of a control circuit for controlling the control lines of the multiplexer of FIG. 3.

The control lines 330 may be controlled in various ways (see FIG. 8 for an exemplary embodiment of a control circuit for controlling the control lines 330). In one embodiment, the control lines 330 are user programmable where a user can write to a register and select the clock frequency, the clock phase(s) or clock cycle(s) to be shrunk and/or stretched, the duty cycle, etc. In another embodiment, the control lines 330 may be controlled by an internal interrupt routine where if a test pin of the microprocessor is enabled, the microprocessor enters a test mode and executes the internal interrupt routine. In yet another embodiment, the control lines 330 may be controlled by microcode where depending on the instruction to be executed, one or more clock phases and/or clock cycles may be varied. It is to be appreciated that various other techniques may be employed to control the control lines 330 and that the techniques described herein are only exemplary.

Figure 4:
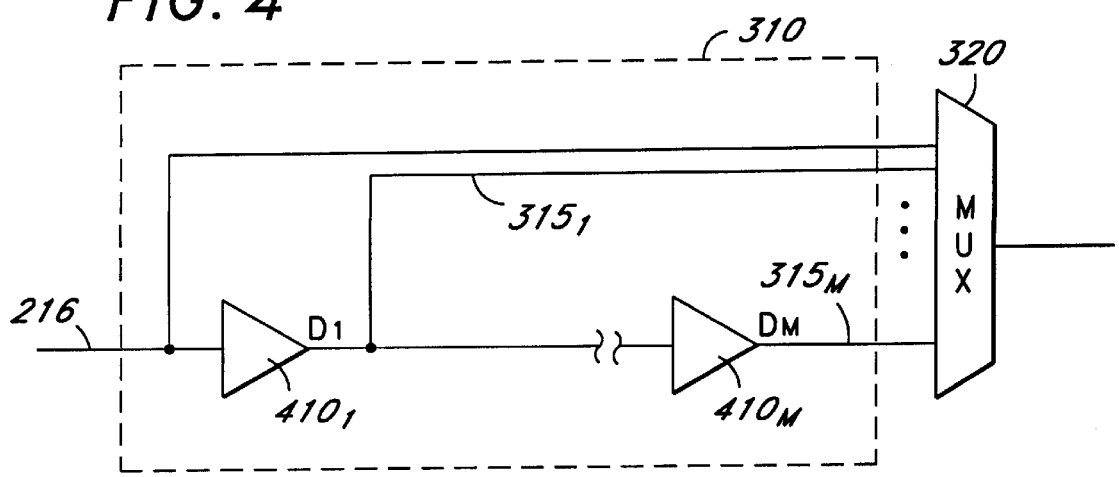
FIG. 4 illustrates an exemplary embodiment of the delay generator circuit of FIG. 3.

FIG. 4 illustrates an exemplary embodiment of the delay generator circuit 310 of FIG. 3. Referring to FIG. 4, the delay generator circuit 310 includes one or more delay circuits $410_1$–$410_M$ which provide one or more delay clock signals $D_1$–$D_M$ on signal lines $315_1$–$315_M$. In this embodiment, the delay circuits are buffers. The delay clock signals $D_1$–$D_M$ are applied to the multiplexer 320 and to a subsequent delay circuit, with the exception of delay clock signal $D_M$ which is only fed to the multiplexer 320. A dummy load may be coupled to the output of the delay circuit $410_M$ to match the load seen by the other delay circuits. In this embodiment, the PLL clock on signal line 216 is also fed to the multiplexer 320. It is to be appreciated that the delay generator circuit 310 is merely exemplary and that other types of delay generator configurations and delay circuits may be used in lieu thereof. In one embodiment, each delay circuit generates the same time delay. However, this is not as restriction of the present invention. In another embodiment, the time delay from one delay circuit to another is different.

FIG. 5 illustrates an exemplary timing diagram of the inputs and output signals of the multiplexer 320 of FIG. 3. In this embodiment, "M" is chosen to be seven for illustration purposes only. However, in another embodiment, "M" may be any whole number greater than zero. Referring to FIG. 5, the PLL clock is the output of the PLL 202 on signal line 216. In this embodiment, the period of the PLL clock is chosen to be 8*t for clarity and illustration purposes only. In this embodiment, delay clock signal $D_1$ is a delayed version of the PLL clock and is delayed by t. Each subsequent delay clock signal ($D_2$, $D_3$, . . . , $D_7$) is delayed by t from the previous delay clock signal ($D_1$, $D_2$, . . . , $D_6$).

The multiplexer 320 provides the TEST CLOCK by selecting, on an edge by edge basis, from delay clocks $D_1$–$D_7$ and the PLL clock. FIG. 5 shows an exemplary test clock, TEST_CLK1 provided on signal line 224 by the multiplexer 320. In this exemplary embodiment, the TEST_CLK1 signal has the same frequency as the PLL clock with the exception of a single shrunk clock cycle. Up to time 510, the TEST_CLK1 signal is the $D_5$ clock signal. Instead of having a falling edge at time 514 (which is the falling edge of the $D_5$ clock signal), the TEST_CLK1 signal is controlled to have a falling edge at time 512 (⅛th of a clock cycle earlier), which is the falling edge of the $D_4$ clock signal. Similarly, instead of having a rising edge at time 518 (which is the rising edge of the $D_4$ clock signal), the TEST_CLK1 signal is controlled to have a rising edge at time 516 (⅛th of a clock cycle earlier), which is the rising edge of the $D_3$ clock signal. Thereafter, the TEST_CLK1 signal is the $D_3$ clock signal. As such, the shrunk clock cycle from time 510 to time 516 has a period of 6*t, which is shrunk by 25% from the other clock cycles.

The present invention may also shrink and/or stretch a single clock phase rather than a whole clock cycle. The TEST_CLK2 signal exemplifies a clock signal having a single shrunk clock phase. Up to time 502, the TEST_CLK2 signal is the $D_6$ clock signal. Instead of having a rising edge at time 506 (which is the rising edge of the $D_6$ clock signal), the TEST_CLK2 signal is controlled to have a rising edge at time 504 (¼th of a clock cycle earlier), which is the rising edge of the $D_4$ clock signal. Thereafter, the TEST_CLK2 signal is the $D_4$ clock signal. As such, the period of the shrunk clock phase from time 502 to time 504 is 2*t. As can be seen in this example, the clock variator circuit of the present invention has shrunk a single clock phase by 50%.

The TEST_CLK3 signal has the same frequency as the PLL clock with the exception of a single shrunk clock cycle. In this case, the period of the shrunk clock is smaller than the shrunk clock of the TEST_CLK1 signal. Up to time 522, the TEST_CLK3 signal is the $D_3$ clock signal. Instead of having a falling edge at time 528 (which is the falling edge of the $D_3$ clock signal), the TEST_CLK3 signal is controlled to have a falling edge at time 524 (⅜th of a clock cycle earlier), which is the falling edge of the PLL clock. Instead of having a rising edge at time 530 (which is the rising edge of the PLL clock), the TEST_CLK3 signal is controlled to have a rising edge at time 526 (⅜ of a clock cycle earlier), which is the rising edge of the $D_5$ clock signal. Thereafter, the TEST_CLK3 signal is the $D_5$ clock signal. As such, the period of the shrunk clock cycle from time 522 to time 526 is 2*t. As can be seen in this example, the clock variator circuit of the present invention has shrunk a single clock cycle by 75%.

In the exemplary embodiment shown where seven delay signals were generated, the granularity for a shrunk (or stretched) clock cycle is ¼ of the PLL clock. This may not be sufficient for speed path testing or other applications. To achieve finer granularity, the delay generator circuit 310 may generate more delayed versions of the PLL clock (e.g., by increasing "M"). However, in this embodiment, the granularity may be limited by the delay of the delay circuits, which may not be sufficient for all test purposes. Alternatively, the interpolating circuit 340 of FIG. 3 may be used to provide finer granularity.

Figure 6A:
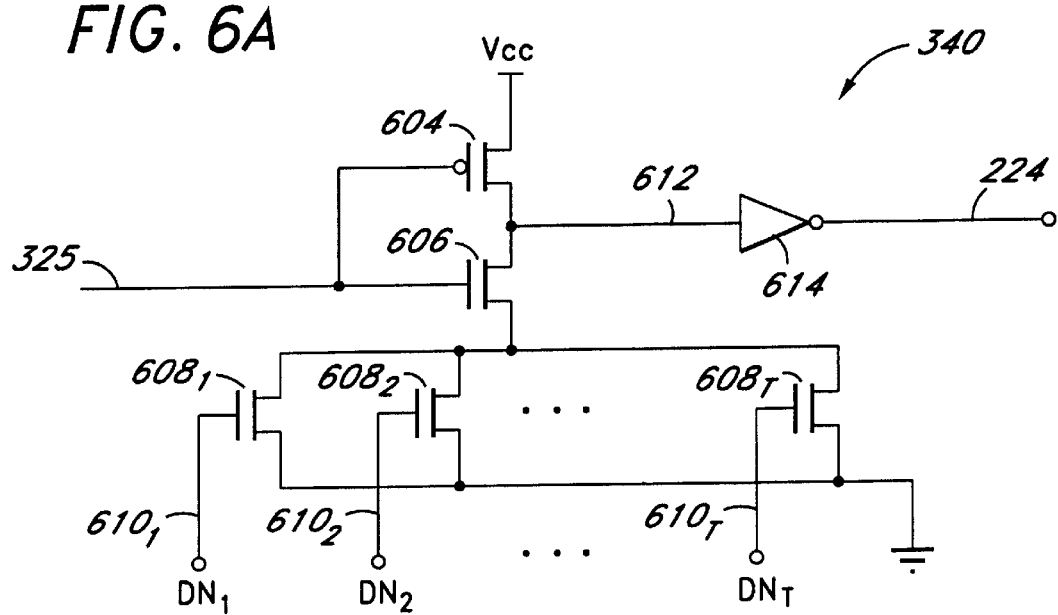
FIG. 6A illustrates an exemplary embodiment of the interpolating circuit of FIG. 3.

FIG. 6A illustrates an exemplary embodiment of the interpolating circuit 340 of FIG. 3. The interpolating circuit 340 provides two main functions. First, the interpolating circuit 340 interpolates a plurality of fine "tics" between each clock cycle. Second, the interpolating circuit 340 multiplexes out the clock on signal line 224. To that end, in one embodiment, the interpolating circuit 340 may be used in lieu of the delay generator circuit 310 and the multiplexer 320 to provide one or more varied clock phases. That is, the interpolating circuit 340 is another embodiment of the present invention with finer granularity. In another embodiment, the interpolating circuit 340 may be used in addition to the delay generator circuit 310 and the multiplexer 320. Referring to FIG. 6A, the TEST CLOCK signal on signal line 325 is fed to the gates of P-channel device 604 and N-channel device 606. Devices 604 and 606 act as an inverter.

When the TEST CLOCK signal is low, device 604 turns on and device 606 turns off such that the signal on signal line 612 is pulled high. On the other hand, when the TEST CLOCK signal is high, the device 604 is turned off and the device 606 is turned on. The timing of the signal on signal line 612 depends on the state of the control lines $DN_1$–$DN_T$ on signal lines $610^1$–$610_T$ (where "T" is a positive whole number). For sake of clarity, "T" is chosen to be three. For example, when the TEST CLOCK signal goes high, if only $DN_1$ is high, device $608_1$ turns on to pull the signal on signal line 612 low (a first "tic"). If $DN_1$ and $DN_2$ are both high when device 606 turns on, then device 606 turns on harder and pulls the signal on signal line 612 low even faster (a second "tic"). If $DN_1$–$DN_3$ are all high when device 606 turns on, then the signal on signal line 612 is pulled low even faster (a third "tic"). In this manner, the timing between "tics" may be made even smaller than the smallest delay provided by the combination of the delay generator circuit 310 and the multiplexer 320. It is important to note that the time period between "tics" does not necessarily have to be equal and is a matter of design choice. For finer granularity, T may be increased.

Figure 6B:
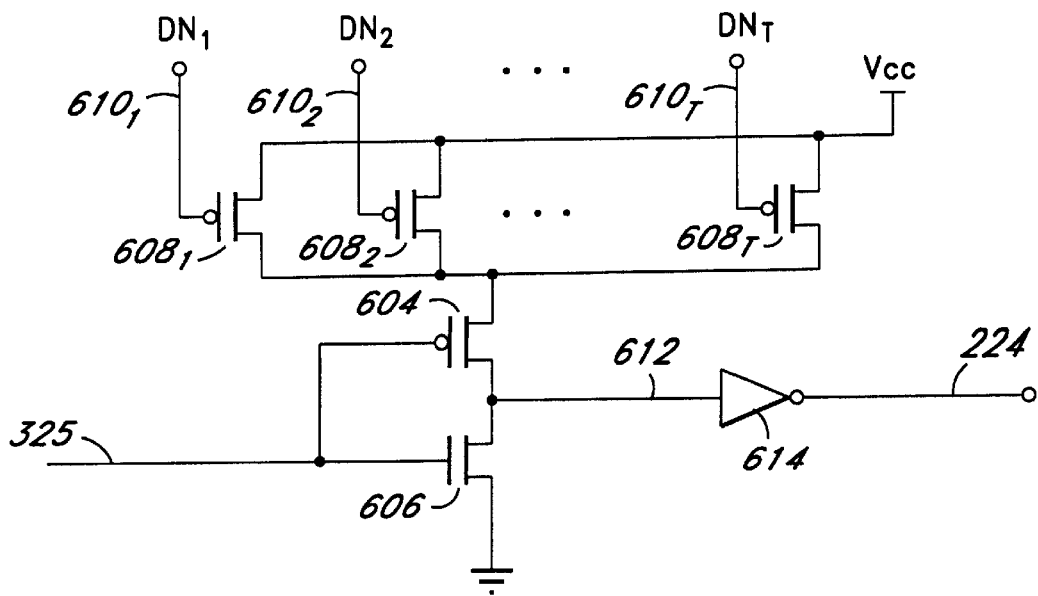
FIG. 6B illustrates another exemplary embodiment of the interpolating circuit of FIG. 3.

The embodiment shown in FIG. 6A is used to vary the delay between the output signal on signal line 224 and the input signal on signal line 325 when the input signal switches from a falling edge to a rising edge. However, to vary the delay between the output signal and the input signal when the input signal switches from a rising edge to a falling edge, the interpolator circuit is modified as shown in FIG. 6B. The embodiments shown in FIGS. 6A and 6B may be combined in a single circuit to vary the delay between the output signal and the input signal when the input signal switched either from a falling edge to a rising edge or from a rising edge to a falling edge.

Figure 7:
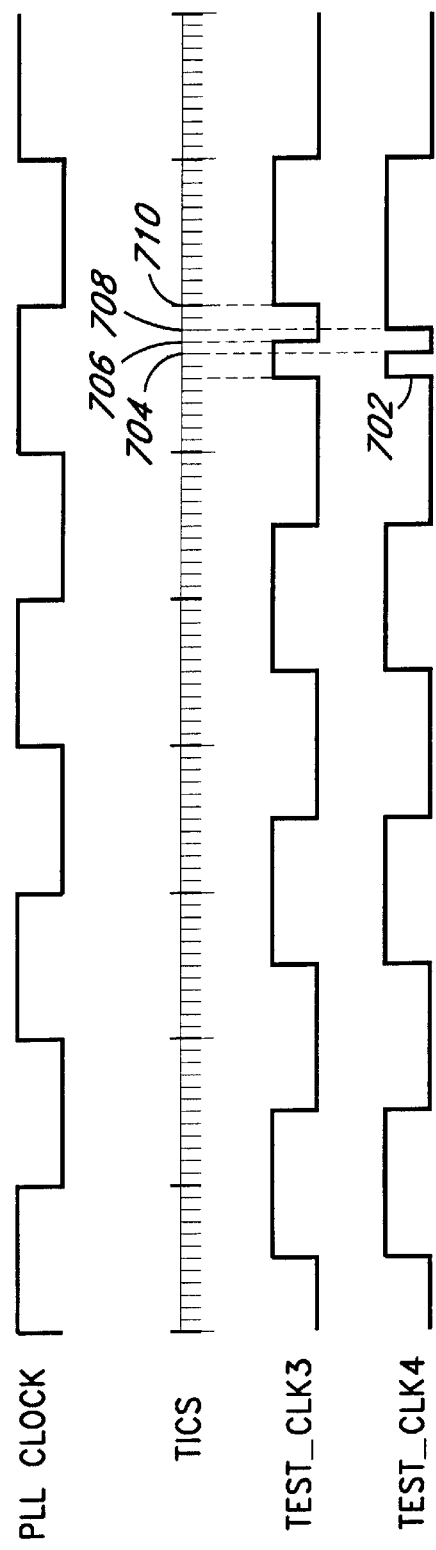
FIG. 7 illustrates a timing diagram of an exemplary output clock signal of the interpolating circuit of FIG. 6A.

FIG. 7 illustrates a timing diagram of an exemplary output clock signal of the interpolating circuit 340 of FIG. 6A. Referring to FIG. 7, the PLL clock signal and the TEST_CLK3 signal are shown for reference purposes. In FIG. 5, the PLL clock was chosen to have a period of 8*t with "M" equal to seven with each delayed clock being delayed by t amount from the previous delayed clock. The TICS signal shows the available tics for the case where "T" is chosen to be equal three. For a high phase of the PLL clock, 12 tics are available. Since the delay generator circuit 310 and multiplexer 320 in FIGS. 3 and 4 provide a granularity of ¼th of the PLL clock, there are 12/4 or three tics interpolated for each ¼th of a clock phase to yield a total granularity of 1/12th of the PLL clock.

An exemplary test clock, TEST_CLK4 is provided on signal line 224 by the clock variator circuit 218. Up to time 702, the TEST_CLK4 signal is the TEST-CLK3. Instead of having a falling edge at time 706 (which is the falling edge of the TEST_CLK3 signal), the TEST_CLK4 signal is controlled (e.g., by only turning on device $608_1$) to have a falling edge at time 704 (one "tic" earlier). Similarly, instead of having a rising edge at time 710 (which is the rising edge of the TEST_CLK3 signal), the TEST_CLK4 signal is controlled to have a rising edge at time 708 (two "tics" earlier). As such, the shrunk clock cycle from time 702 to time 708 has a period of ⅔*t, which is shrunk by 33% from the shrunk clock of the TEST_CLK3 signal.

FIG. 8 illustrates an exemplary embodiment of a control circuit 800 for controlling the control lines 330 of the multiplexer 320 of FIG. 3. Referring to FIGS. 3 and 8, the control circuit 800 includes a register file 810 containing Y entries (where "Y" is a positive whole number), where each entry in the register file 810 selects a specific clock (delayed or the original clock) to be provided on signal line 325 by controlling the control lines 330. The control circuit 800 further includes a clock pointer 820 that can be changed to point to any entry in the register file 810 on a phase by phase basis. Each time the clock pointer 820 changes to a new entry, the output clock is changes to a different clock to change the frequency of at least one phase.

Referring to FIGS. 5 and 8, an example is provided for sake of clarity. Initially, entries R0 and R1 are loaded to select the $D_4$ and $D_3$ clocks respectively. During execution, the clock pointer is set to point to entry R0 which causes the output clock to be the $D_4$ clock. At a point where a shrunk clock is desired (e.g., time 512), the clock pointer is incremented to point to entry R1 and the next output clock edge is generated from $D_3$ (time 516), which is earlier than the next clock edge of $D_4$. Thereafter, the output clock is $D_3$ (unless the pointer is changed again). The control circuit 800 presupposes a mechanism to load one or more entries in the register file and a state machine to increment the clock pointer 820 at the desired time.

It is be appreciated to one skilled in the art that although the exemplary embodiments of the present invention has been described within a microprocessor, the present invention may be implemented in various types of integrated circuits such as, but not limited or restricted to, a microcontroller, an application specific integrated circuit ("ASIC"), a graphics chip, a sequential circuit, and the like.

In addition to providing speed path debugging, the present invention may be used to optimize the clock usage of an integrated circuit. In this embodiment, the clock variator circuit provides the CORE CLOCK for both the normal mode and the test mode. During normal mode, the CORE CLOCK may be varied for certain instructions (e.g., by controlling the clock variator circuit through microcode). For example, if an instruction exercises a functional units (e.g., circuit) that fails with the CORE CLOCK, the CORE CLOCK can be stretched for the clock cycles for that instruction. Conversely, if an instruction exercises a functional unit that operates at a higher frequency than the CORE CLOCK, the CORE CLOCK can be shrunk for the clock cycles for that instruction. This technique allows a CORE CLOCK to be intelligently varied to optimize the speed of the integrated circuit. A further advantage is that the divider circuit 220 and the multiplexer 230 are not needed.

Because a varied clock can feedback to the PLL and cause it to lose its lock, a separate feedback loop is provided for when the clock is varied. During normal PLL operation, the actual clock spine output is fed back into the PLL to help maintain the phase lock. Introducing a large enough shrink and/or stretch into this network could cause the PLL to jitter or even lose lock. To prevent this, during clock shrinking and/or clock stretching, a separate loop is fed back to the PLL. While the clock spine sees a varied clock, this separate loop is shielded from the varied clock. In this way, the PLL maintains its lock.

As discussed above, the clock variator circuit of the present invention provides the ability to change the frequency domain of a microprocessor (or any other synchronous IC design) during the normal runtime of the chip. This is a powerful design-for-testability feature that can be used, for example, to "shrink" the period of a single clock, thereby stressing any functional units.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A circuit contained in an integrated circuit having one or more functional units, the circuit to vary one or more phases of a clock, comprising:

a delay generator coupled to receive an input clock, and to generate at least two delayed clocks that are delayed from the input clock and each other;

a select circuit coupled to receive the at least two delayed clocks on input terminals and provide an output clock on an output terminal, the select circuit having at least one control terminal;

a control circuit coupled to the at least one control terminal of the select circuit, said control circuit to cause the select circuit to switch the output clock from a first to a second of the least two delayed clocks on a first edge for varying a phase of the output clock; and an interpolating circuit coupled to the output terminal, said interpolating circuit to interpolate one or more fine tics between phases of the output clock for providing a modified output clock to the one or more functional units, the modified output clock having a finer granularity than the output clock.

2. The circuit of claim 1 wherein the select circuit comprises a multiplexer.

3. The circuit of claim 1 wherein the first edge is a falling edge.

4. The circuit of claim 1 wherein the first edge is a rising edge.

5. The circuit of claim 1 wherein the control circuit controls the select circuit to switch the output clock from the first to the second of the at least two delayed clocks on the first edge for shrinking one or more phases of the output clock for providing the output clock to the one or more functional units.

6. The circuit of claim 1 wherein the control circuit controls the select circuit to switch the output clock from the first to the second of the at least two delayed clocks on the first edge for stretching one or more phases of the output clock for providing the output clock to the one or more functional units.

7. The circuit of claim 1 wherein the select circuit receives the input clock, and said control circuit controls the select circuit to subsequently switch the output clock from the second of the at least two delayed clocks to the input clock on a second edge to provide a varied clock cycle.

8. The circuit of claim 7 wherein the first edge is a falling edge and the second edge is a rising edge.

9. The circuit of claim 7 wherein the first edge is a rising edge and the second edge is a falling edge.

10. The circuit of claim 1 wherein the delay generator includes:

a first delay circuit coupled to receive the input clock and provide the first delayed clock; and a second delay circuit coupled to receive the first delayed clock and provide the second delayed clock.

11. The circuit of claim 1 wherein said interpolating circuit further comprises:
- a first device of a first conductivity type having a gate coupled to the output terminal of the select circuit, a drain, and a source;
- a second device of a second conductivity type having a gate coupled to the gate of the first device, a drain coupled to the drain of the first device, and a source;
- a first series of one or more devices of the first conductivity type each having a gate coupled to a respective one of a first series of one or more control terminals, a drain coupled to the source of the first device, and a source coupled to a first power supply terminal;
- a second series of one or more devices of the second conductivity type each having a gate coupled to a respective one of a second series of one or more control terminals, a drain coupled to the source of the second device, and a source coupled to a second power supply terminal; and
- an inverter including an input terminal coupled to the drains of the first and second devices, and an output terminal having the second output clock thereon for providing the modified output clock.

12. A method for varying a phase of a clock received by a device, comprising:
- generating at least two delayed clocks from an input clock, said at least two delayed clocks being delayed from each other and the input clock;
- selecting a first of the at least two delayed clocks as an output clock;
- switching the output clock from the first to a second of the at least two delayed clocks on a first edge for varying a phase of the output clock;
- interpolating one or more fine tics between phases of the output clock to provide a second output clock that has finer granularity than the output clock; and
- providing the second output clock to one or more functional units within the device.

13. The method of claim 12 wherein providing comprises providing the output clock to one or more functional units for testing speed paths within the functional units, said output clock having at least a phase that is of a different duration than other phases.

14. The method of claim 12 further comprising switching the output clock from the second of the at least two delayed clocks to the input clock on a second edge to provide a varied clock cycle.

15. The method of claim 14 wherein switching comprises switching the output clock from the first to the second of the at least two delayed clocks on the first edge for stretching one or more phases of the output clock.

16. The method of claim 14 wherein switching comprises switching the output clock from the first to the second of the at least two delayed clocks on the first edge for shrinking one or more phases of the output clock.

17. A circuit contained in a device, the circuit for varying a phase of a clock, comprising:
- a delay generator coupled to receive an input clock, and to generate at least one delayed clock from the input clock;
- a selector coupled to receive the at least one delayed clock and the input clock on input terminals, and provide an output clock on an output terminal for coupling to one or more functional units within the device, said selector having at least one control terminal;
- a control circuit coupled to the at least one control terminal, said control circuit to control the selector to switch the output clock from a first to a second of the at least one delayed clock and the input clock on a first edge for varying at least a phase of the output clock; and
- an interpolating circuit coupled to receive the output clock, said interpolating circuit to interpolate one or more fine tics between phases of the output clock, and provide a second output clock that has finer granularity than the output clock.

18. The circuit of claim 17 wherein said control circuit controls the selector to provide at least one clock phase that is shrunk from other clock phases of the output clock.

19. The circuit of claim 17 wherein said control circuit controls the selector to provide at least one clock phase that is stretched from other clock phases of the output clock.

20. The circuit of claim 17 wherein said control circuit controls the selector to provide at least one clock phase that is varied from other clock phases of the output clock for testing speed paths contained within the one or more functional units of the device.

21. The circuit of claim 17 wherein said interpolating circuit further comprises:
- a first device of a first conductivity type having a gate coupled to the output terminal of the select circuit, a drain, and a source;
- a second device of a second conductivity type having a gate coupled to the gate of the first device, a drain coupled to the drain of the first device, and a source;
- a first series of one or more devices of the first conductivity type each having a gate coupled to a respective one of a first series of one or more control terminals, a drain coupled to the source of the first device, and a source coupled to a first power supply terminal;
- a second series of one or more devices of the second conductivity type each having a gate coupled to a respective one of a second series of one or more control terminals, a drain coupled to the source of the second device, and a source coupled to a second power supply terminal; and
- an inverter including an input terminal coupled to the drains of the first and second devices, and an output terminal having the second output clock thereon for providing the modified output clock.

* * * * *

UNITED STATES PATENT AND TRADEMARK OFFICE
CERTIFICATE OF CORRECTION

PATENT NO.      : 6,127,858
DATED           : October 3, 2000
INVENTOR(S)     : Stinson et al.

It is certified that error appears in the above-identified patent and that said Letters Patent is hereby corrected as shown below:

Column 8,
Line 26, delete "of the least" and insert -- of the at least --.

Signed and Sealed this

Thirty-first Day of December, 2002

JAMES E. ROGAN
*Director of the United States Patent and Trademark Office*